(12) United States Patent
Lee et al.

(10) Patent No.: US 11,845,250 B2
(45) Date of Patent: Dec. 19, 2023

(54) AUTOCLAVE AND METHOD FOR MANUFACTURING DISPLAY DEVICE USING THE SAME

(71) Applicant: SAMSUNG DISPLAY CO., LTD., Yongin-si (KR)

(72) Inventors: Jung Kyu Lee, Incheon (KR); Ho Yun Byun, Hwaseong-si (KR); Won-Seok Kim, Seoul (KR); Jong Deok Park, Seoul (KR); Jung Hoon Shin, Seongnam-si (KR); Sun Ok Oh, Hwaseong-si (KR); Ae Ly Oh, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 2 days.

(21) Appl. No.: 17/196,818

(22) Filed: Mar. 9, 2021

(65) Prior Publication Data
US 2021/0291508 A1    Sep. 23, 2021

(30) Foreign Application Priority Data
Mar. 20, 2020    (KR) .................. 10-2020-0034685

(51) Int. Cl.
*B01J 3/04* (2006.01)
*B32B 37/00* (2006.01)
*B32B 37/12* (2006.01)
*B32B 37/10* (2006.01)
*H10K 50/86* (2023.01)
(Continued)

(52) U.S. Cl.
CPC ............. *B32B 37/0007* (2013.01); *B01J 3/04* (2013.01); *B32B 37/10* (2013.01); *B32B 37/12* (2013.01); *H10K 50/841* (2023.02); *H10K 50/86* (2023.02); *H10K 59/12* (2023.02); *H10K 59/40* (2023.02); *H10K 71/00* (2023.02); *B32B 2037/1253* (2013.01); *B32B 2310/0831* (2013.01); *B32B 2457/20* (2013.01); *H10K 59/1201* (2023.02)

(58) Field of Classification Search
CPC ........ B01J 3/04; B32B 37/12; B32B 37/0007; B32B 37/10; B32B 2037/1253; B32B 2310/0831; B32B 2457/20; H01L 27/3244; H01L 51/524; H01L 51/56; H01L 2227/323; H10K 50/841; H10K 59/12; H10K 59/1201; H10K 71/00; G02F 1/1303
See application file for complete search history.

(56) References Cited

U.S. PATENT DOCUMENTS

| | | | | |
|---|---|---|---|---|
| 6,207,118 | B1 * | 3/2001 | Gaven | B29C 35/08 422/186.3 |
| 2010/0196622 | A1 * | 8/2010 | Van Pul | B05D 3/067 315/112 |
| 2020/0331248 | A1 * | 10/2020 | Nemeth | B32B 7/12 |

FOREIGN PATENT DOCUMENTS

| KR | 10-2007-0121884 | 12/2007 |
|---|---|---|
| KR | 10-1348745 | 12/2013 |

(Continued)

OTHER PUBLICATIONS

Machine translation of KR 10-2015-0069867 date unknown.*

*Primary Examiner* — John L Goff, II
(74) *Attorney, Agent, or Firm* — H.C. Park & Associates, PLC

(57) ABSTRACT

An autoclave includes a case, a chamber disposed inside the case, a cassette disposed inside the chamber, and a plurality of light sources mounted inside the cassette.

3 Claims, 8 Drawing Sheets

(51) Int. Cl.
  *H10K 50/84*  (2023.01)
  *H10K 59/12*  (2023.01)
  *H10K 59/40*  (2023.01)
  *H10K 71/00*  (2023.01)

(56) References Cited

FOREIGN PATENT DOCUMENTS

KR   10-2015-0069867     6/2015
KR   10-1923560          11/2018
WO   WO-2017135711 A1 *  8/2017   ........... G02F 1/1303

* cited by examiner

AUTOCLAVE AND METHOD FOR MANUFACTURING DISPLAY DEVICE USING THE SAME

CROSS-REFERENCE TO RELATED APPLICATION

This application claims priority from and the benefit of Korean Patent Application No. 10-2020-0034685, filed on Mar. 20, 2020, which is hereby incorporated by reference for all purposes as if fully set forth herein.

BACKGROUND

Field

Embodiments/implementations of the invention relate generally to display manufacturing and, more specifically, to an autoclave and a manufacturing method of a display device using the same.

Discussion of the Background

A display device such as an organic light emitting diode display or a liquid crystal display includes a display panel having a screen for displaying an image. The display device includes a window that can transmit an image displayed on the display panel while protecting the display panel.

The display panel and the window may be attached by using an adhesive. For example, an optically clear adhesive (OCA) having a form of a film may be attached to the display panel or the window, and the display panel and the window may be laminated.

After such lamination, an adhesive layer of an adhesive is formed between the display panel and the window, and bubbles (or vapor) may be generated between the display panel and the adhesive layer, between the window and the adhesive layer, and/or in the adhesive layer. The display device may be disposed in an autoclave to remove the bubbles at a high temperature and pressure before curing the adhesive layer after the lamination.

The above information disclosed in this Background section is only for understanding of the background of the inventive concepts, and, therefore, it may contain information that does not constitute prior art.

SUMMARY

The present inventors have discovered that, even when air bubbles are removed from the display device through such an autoclave process, bubbles may be generated in the display device after the autoclave process and before a curing process of the adhesive layer. These bubbles may remain after the curing process of the adhesive layer, and may be recognized by a user.

Devices constructed according to embodiments of the invention are capable of providing an autoclave capable of suppressing generation of bubbles in a display device, and methods according to implementations of the invention are capable of providing a method of manufacturing the display device using the autoclave.

Additional features of the inventive concepts will be set forth in the description which follows, and in part will be apparent from the description, or may be learned by practice of the inventive concepts.

An autoclave according to an embodiment includes a case, a chamber disposed inside the case, a cassette disposed inside the chamber, and one or more light sources mounted inside the cassette.

The cassette may include a frame and a plurality of spaces partitioned by the frame, and the light sources may be disposed in each of the spaces.

The frame may include shelves disposed in a horizontal direction, and the light sources may be mounted on lower surfaces of the shelves.

The autoclave may further include a power supply disposed inside the cassette, and wires electrically connecting the power supply and the light sources.

The autoclave may further include a power supply positioned outside the chamber, and the light sources may be electrically connected to the power supply to receive electrical energy from the power supply.

The cassette may include a frame and a plurality of shelves that are rotatably positioned inside the frame.

The cassette may include a frame, a plurality of spaces partitioned by the frame, and a plurality of shelves that are rotatably positioned in each of the spaces.

Each of the light sources may include a UV lamp.

The autoclave according to an embodiment includes a chamber, and a cassette disposed inside the chamber. The cassette may include a plurality of shelves on which display devices are disposed, and one or more light sources for irradiating light to the display devices.

The cassette may include a frame and a plurality of spaces partitioned by the frame, and the light sources may be disposed one by one in each of the spaces.

The frame may include the shelves disposed in a horizontal direction, and the light sources may be mounted on lower surfaces of at least two of the shelves.

The cassette may further include a power supply, and wires electrically connecting the power supply and the light sources.

The light sources may be electrically connected to a power supply disposed outside the chamber to receive electrical energy from the power supply.

The cassette may include a frame, and the shelves may be rotatably positioned inside the frame.

The cassette may include a frame and a plurality of spaces partitioned by the frame, and the shelves may be rotatably positioned in each of the spaces.

A manufacturing method of a display device according to an embodiment includes laminating a display panel and a window by using an adhesive, placing the display device in which the display panel and the window are laminated inside a cassette that is disposed or is to be disposed in a chamber of an autoclave, pressurizing an interior of the chamber while the cassette is disposed inside the chamber, and irradiating light to the display device while the interior of the chamber is pressurized.

The method may further include depressurizing the interior of the chamber to atmospheric pressure after the irradiating of the light.

The pressurizing of the interior of the chamber may include removing bubbles from the display device.

The irradiating of the light to the display device may include curing the adhesive.

The irradiating of the light may be performed by using a light source mounted inside the cassette.

According to embodiments, since the bubble removing process and the curing process of the adhesive layer may be performed in the autoclave, bubble generation in the display device may be prevented. In addition, since two processes may be performed in one device, the process time may be shortened, and since multiple display devices may be processed at once, the process time may be further shortened. In addition, although not specifically mentioned, according to embodiments, there are other advantageous effects that can be recognized throughout the specification.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
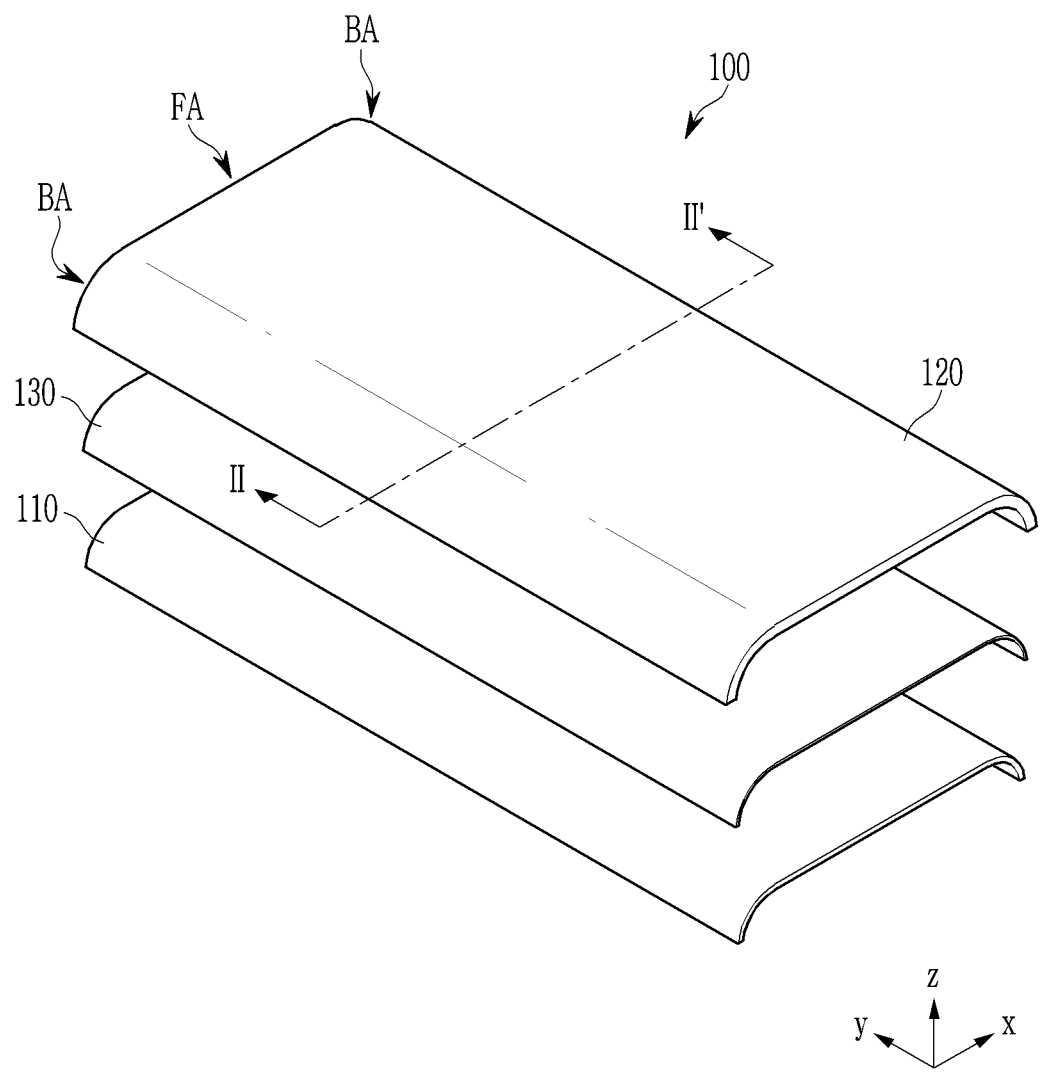
FIG. 1 illustrates a schematic exploded perspective view of a display device according to an embodiment of the inventive concepts.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In the drawings, a reference character x is used for indicating a first direction, y is used for indicating a second direction that is perpendicular to the first direction, and z is used for indicating a third direction that is perpendicular to the first direction and the second direction. The first direction x, the second direction y, and the third direction z may correspond to a horizontal direction, a vertical direction, and a thickness direction of the display device, respectively.

Unless otherwise described in the specification, "overlapping" indicates overlapping in a plan view, and indicates overlapping in the third direction z.

Figure 2:
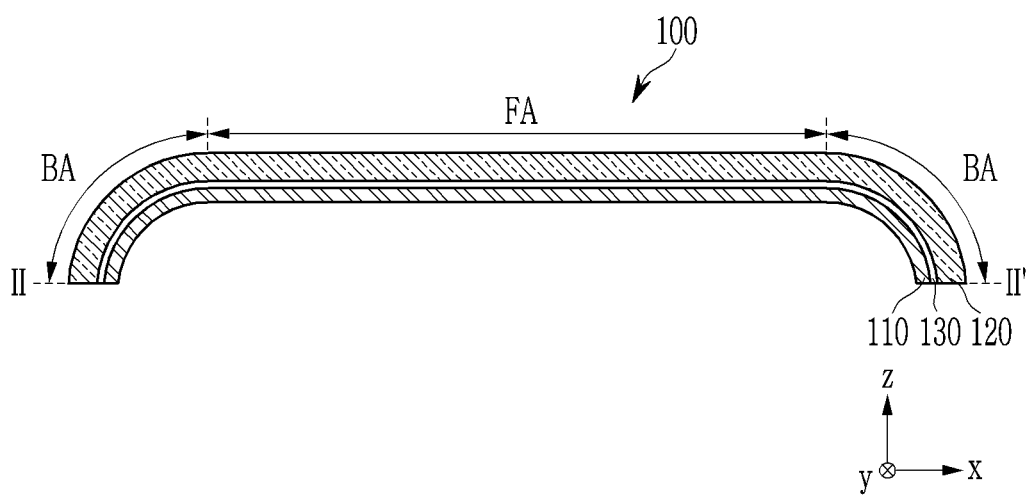
FIG. 2 illustrates a cross-sectional view taken along a line II-IF of FIG. 1.

FIG. 1 illustrates an exploded perspective view of a display device 100 according to an embodiment, and FIG. 2 illustrates a cross-sectional view taken along a line II-IF of FIG. 1.

Referring to FIG. 1 and FIG. 2, the display device 100 may include a display panel 110 and a window 120 disposed in front of the display panel 110. The display device 100 may be an electronic device such as a smart phone, a mobile phone, a tablet, a multimedia player, a portable information terminal, or a module used for such an electronic device.

One or more of four edge areas of the display device 100 may be bent. In the illustrated embodiment, the display device 100 has a pair of opposite edge regions that are bent. When bending, the display device 100 may include a flat area FA that is substantially flat and a bent area BA positioned at opposite sides of the flat area FA. In the display device 100, each of the display panel 110 and the window 120 may include a flat area and a bent area corresponding to the flat area FA and the bending area BA of the display device 100, respectively. The display device 100 may be entirely flat, and may not include a bent area.

In the display device 100, the display panel 110 and the window 120 are attached to each other. An adhesive such as an optically clear adhesive (OCA) may be used for attaching the display panel 110 and the window 120, and an adhesive layer 130 formed of such an adhesive may be disposed between the display panel 110 and the window 120.

The display panel 110 may be a light emitting display panel including light emitting elements such as light emitting diodes. At least a portion of the display panel 110 may be flexible. The display panel 110 may include a display area corresponding to a screen on which an image is displayed, and a non-display area in which no image is displayed. Pixels may be arranged in the display area, and images may be displayed by a combination of pixels. Signal lines that transfer signals for driving the pixels are arranged in the display area. For example, scan lines transferring scan signals may extend in a first direction x, and data lines transferring data signals may extend in a second direction y. Each of the pixels may be connected to a transistor connected to a data line and a gate line, to receive data signal (voltage) for controlling the luminance of the pixel at predetermined timing.

The non-display area may be positioned near an edge of the display panel 110, and may be positioned around the display area. The non-display area is an area in which circuits and/or wires for generating and/or transferring various signals applied to the display area are disposed. A pad portion including pads for receiving signals from the outside of the display panel 110 or outputting signals to the outside of the display panel 110 may be positioned in the non-display area. A flexible printed circuit film may be bonded to the pad portion.

Since opposite edge areas of the display panel 110 are bent, when the display device 100 is viewed from the front, the non-display area may hardly be seen. Accordingly, a screen may occupy most of the area visible when the display device 100 is viewed from the front, and a screen-to-body ratio of the display device 100 may be maximized.

The window 120 may protect the display panel 110 from external environments, impacts, and the like. The window 120 may serve as a supporter for maintaining a bending state of the display panel 110. The window 120 may be formed of a transparent and rigid material, such as glass and plastic, such that an image displayed on the screen of the display panel 110 can be viewed. In the window 120, at least an area corresponding to the screen may be optically transparent.

The bending of the window 120 may be performed, e.g., by thermoforming a glass plate, a plastic plate, or the like.

The adhesive layer 130 may be formed by an adhesive such as an optically transparent adhesive (OCA) or optically transparent resin (OCR). For example, the adhesive layer 130 may be formed by attaching an adhesive such as a light-curable OCA to the display panel 110 or the window 120 and laminating the display panel 110 and the window 120, and then curing the adhesive between display panel 110 and the window 120.

Figure 3:
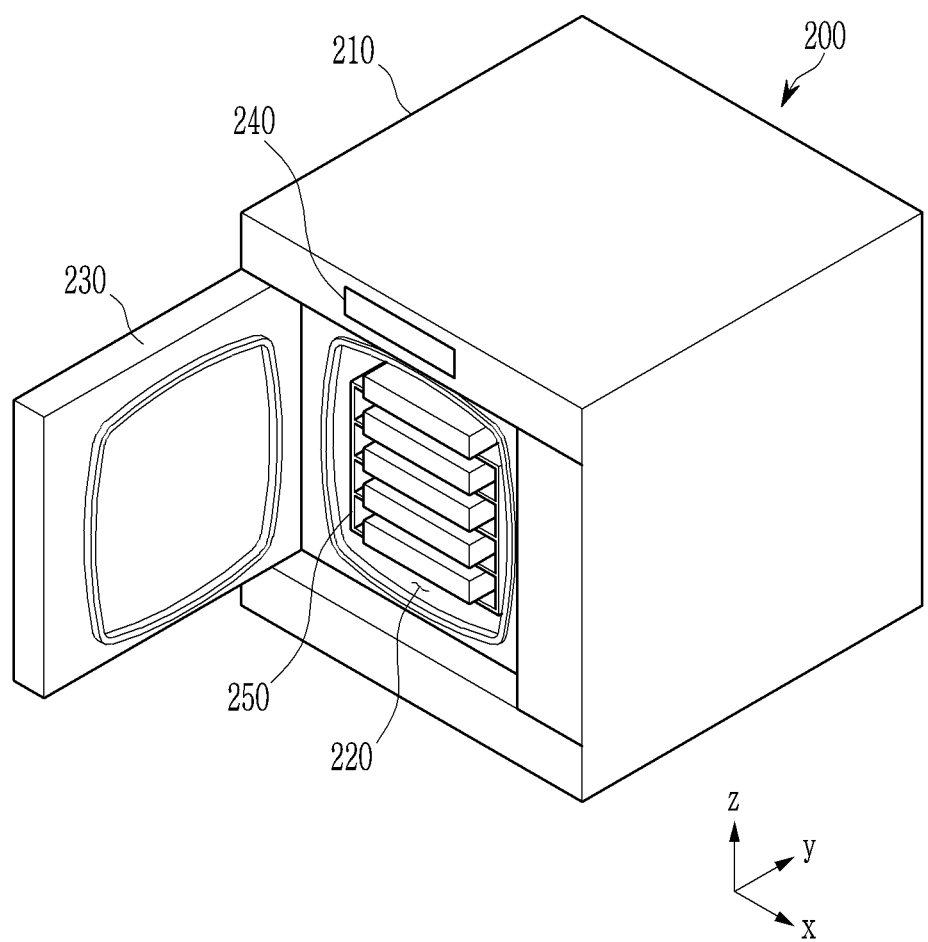
FIG. 3 illustrates a schematic exploded perspective view of an autoclave according to an embodiment.

FIG. 3 illustrates a schematic exploded perspective view of an autoclave 200 according to an embodiment.

Referring to FIG. 3, the autoclave 200 is a type of pressure chamber that can be used to perform a process requiring a higher temperature and pressure than the surroundings. The autoclave 200 may include a case 210, a chamber 220 disposed inside the case 210, a door 230 for opening and closing the chamber 220, a controller 240 for controlling an internal environment of the chamber 220, and a cassette 250 disposed inside the chamber 220. The controller 240 may include a temperature adjuster (not illustrated) for adjusting a temperature inside the chamber 220 and a pressure adjuster (not illustrated) for adjusting a pressure. The temperature adjuster may include a heater, and the pressure adjuster may include a fan. The internal environment of the chamber 220 may be adjusted to or maintained at a predetermined temperature and pressure by manipulating the controller 240 to operate the temperature adjuster and the pressure adjuster.

The display device 100 in which the display panel 110 and the window 120 are laminated may be disposed inside the cassette 250 and the chamber 220 may be closed and sealed by closing the door 230, and then may be maintained at a predetermined temperature and pressure for a predetermined time by heating and pressurizing an interior of the chamber 220, to thereby remove the bubbles present in the display device 100. The process of removing the bubbles from the display device 100 by using the autoclave 200 as described above is referred to as an autoclave process. The autoclave process may be performed for, e.g., about 5 hours in a state where the temperature and pressure inside the chamber 220 are raised from room temperature and atmospheric pressure to about 50° C. and about 7 bar. Herein, the temperature, the pressure, and the time may be varied.

After performing the autoclave process, a curing process for curing the adhesive layer 130 of the display device 100 may be performed inside the chamber 220 in a state where the interior of the chamber 220 is not depressurized (that is, while maintaining a pressurized state during the autoclave process). The adhesive layer 130 may be formed by using a photocurable OCA, e.g., an ultraviolet (UV) curable OCA. A light source (not illustrated) capable of irradiating light to the display device 100 may be mounted inside the cassette 250 in order to cure the adhesive layer 130. The light source may be disposed to face the display device 100 inside the cassette 250. The light source may be operated under the control of the controller 240, or may be operated by a timer switch (not illustrated) mounted in the cassette 250. During the curing process, the temperature inside the chamber 220 may be maintained to be the same as the temperature during the autoclave process, or may be lower (e.g., a temperature drops because the heater is switched off).

After the curing process in the autoclave 200 is completed, the inside of the chamber 220 may be depressurized to, e.g., atmospheric pressure, to open the door 230, and the display device 100 may be taken out of the chamber 220 and the cassette 250.

Typically, after performing the autoclave process, the chamber 220 is depressurized, and the display device 100 is taken out of the chamber 220 and disposed in a device capable of performing a curing process to cure the adhesive layer 130. According to this process, even if air bubbles are removed in the autoclave process, air bubbles may be generated in the display device 100 in the normal pressure state after depressurizing the chamber 220. It is believed that since the adhesive layer 130 is depressurized before being cured, air may penetrate from edges of the display device 100 while the edges of the display device 100 are finely opened.

A vicinity of the edges of the display device 100 may be a non-display area, and bubbles may be positioned in a non-display area. The bubbles positioned in the non-display area may not be visible because it is covered by a printed layer applied to the non-display area of the window 120, for example. However, as the non-display area is gradually reduced and the screen to body ratio is increased, permeable bubbles generated by air permeating from the edges of the display device 100 may be positioned in the display area. The bubbles positioned in the display area may be recognized by the user, thereby deteriorating the quality of the display device 100.

According to an embodiment, the curing process is performed in the chamber 220 in a state where the chamber 220 is not depressurized and the bubbles are removed and are not generated. Accordingly, it is possible to prevent the permeable bubbles that may be generated after the pressure depressurization of the chamber 220 and before the curing of the adhesive layer 130. According to an experimental result, when a curing degree of the adhesive layer 130 is high (e.g., a gel fraction is 85% or more), it is found that no permeable bubble is generated. That is, permeable bubbles are not generated after curing of the adhesive layer 130 (although bubbles not removed by the autoclave process may remain).

In addition, since the autoclave process and the curing process may be performed in one chamber 220, the process time may be shortened.

A structure of the cassette 250 and a disposal of the display device 100 and the light source LS in the cassette 250 will be described with reference to FIG. 4 to FIG. 7.

Figure 4:
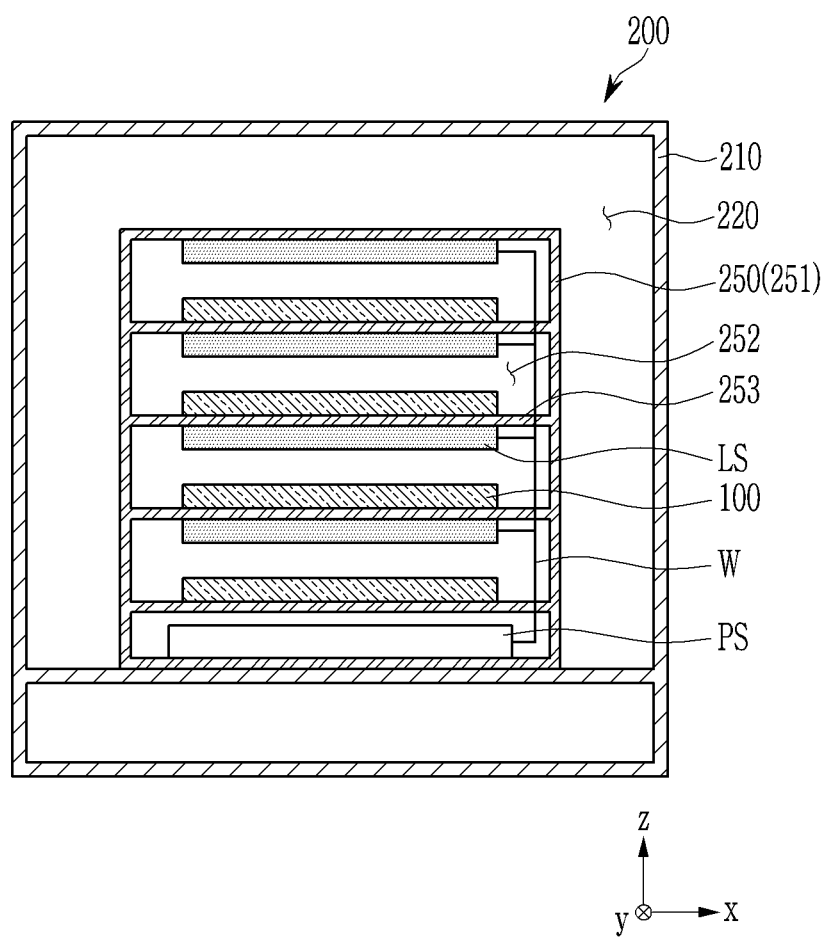
FIG. 4 illustrates a schematic cross-sectional view of an autoclave according to an embodiment.
Figure 5:
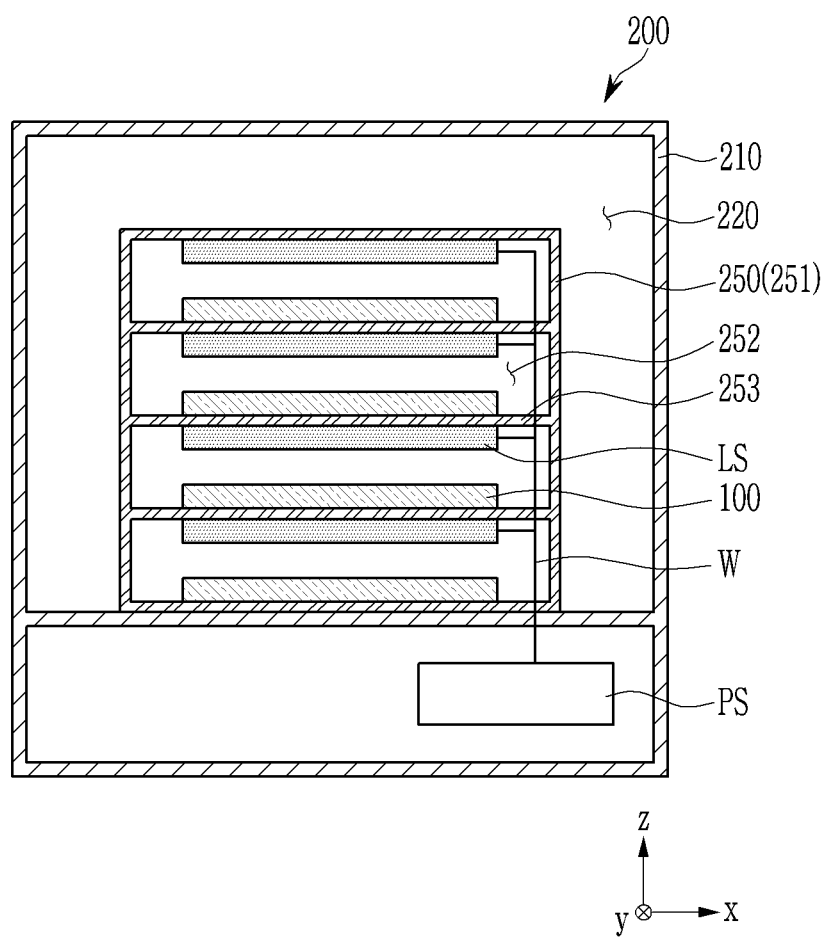
FIG. 5 illustrates a schematic cross-sectional view of an autoclave according to an embodiment.
Figure 6:
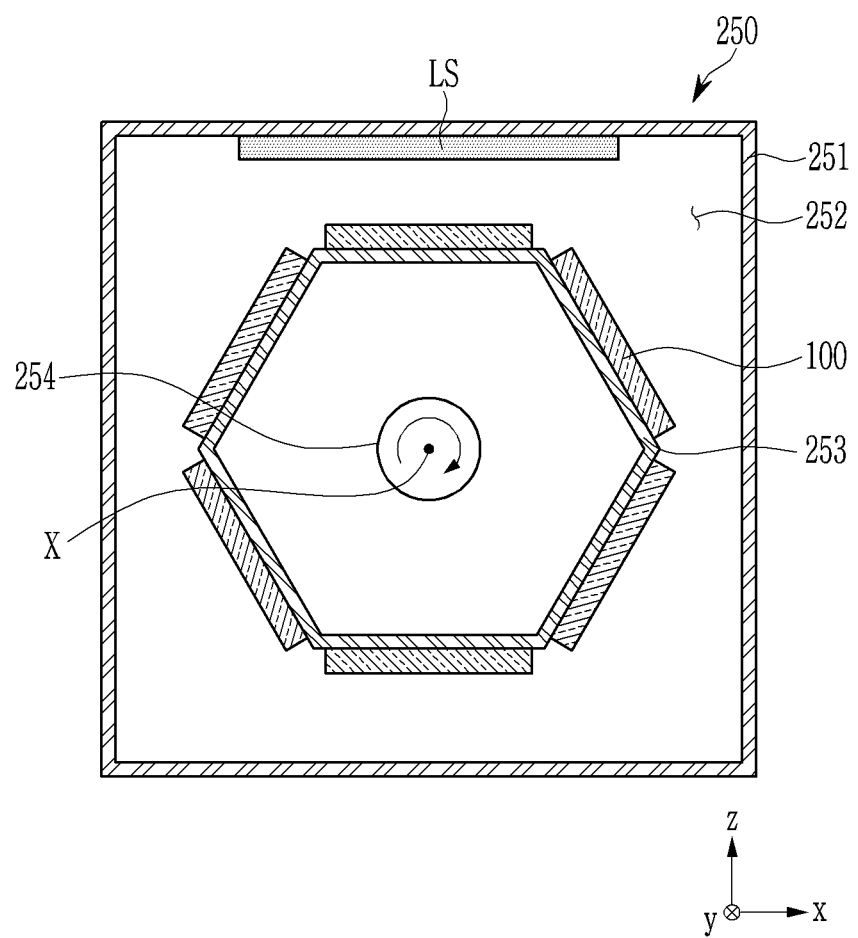
FIG. 6 illustrates a schematic cross-sectional view of an autoclave according to an embodiment.
Figure 7:
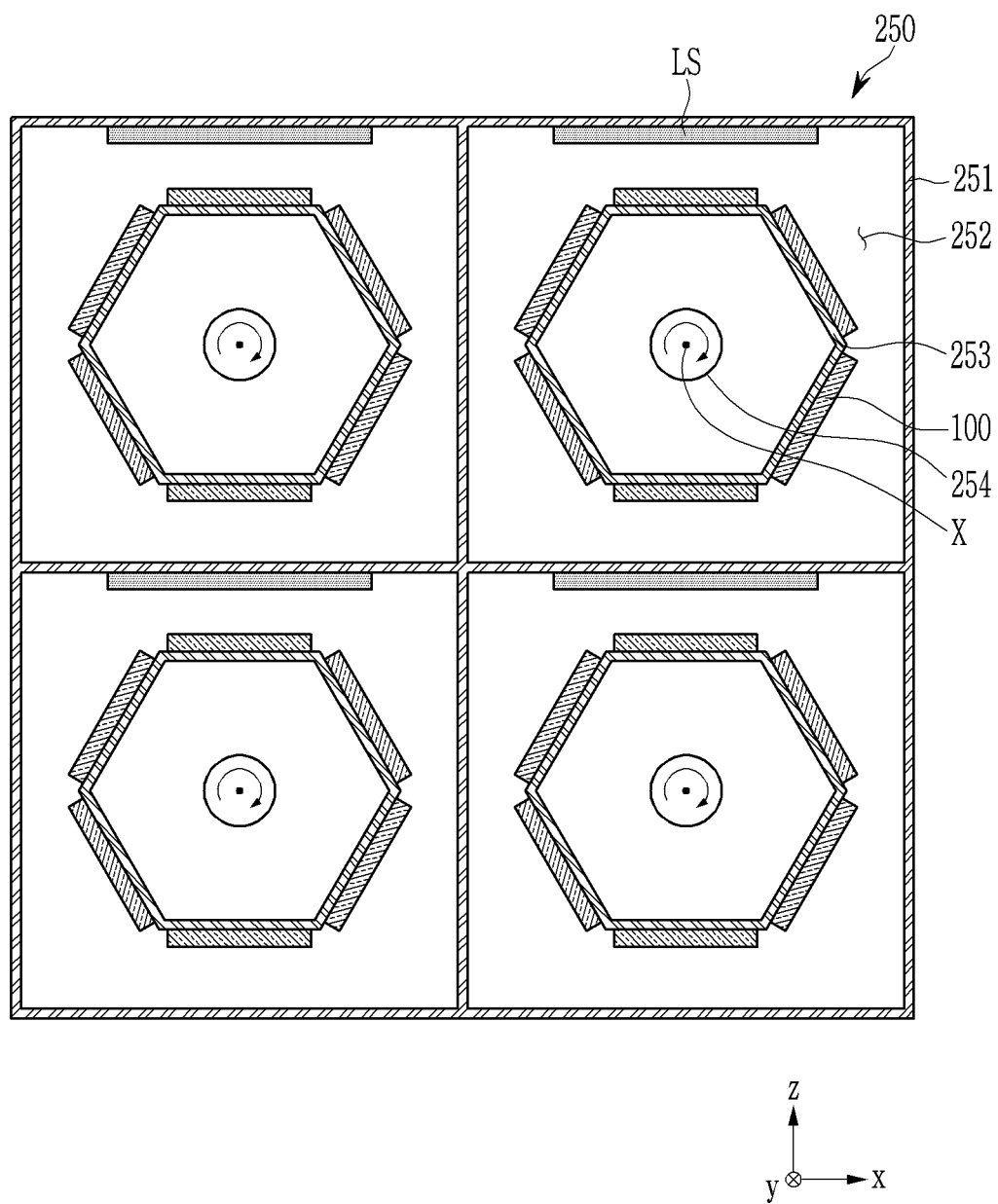
FIG. 7 illustrates a schematic cross-sectional view of an autoclave according to an embodiment.

FIG. 4 and FIG. 5 illustrate schematic cross-sectional views of the autoclave 200 according to embodiments, and FIG. 6 and FIG. 7 illustrate schematic cross-sectional views of the cassette 250 according to embodiments, respectively. First, the embodiment of FIG. 4 will be described, and the embodiments of FIGS. 5, 6, and 7 will be mainly described based on differences from the embodiment of FIG. 4.

Referring to FIG. 4, the cassette 250 disposed inside the chamber 220 of the autoclave 200 may include a frame 251 and spaces 252 defined by the frame 251. The spaces 252 are not sealed, and the space 252 is formed to be in fluid communication with the outside of the cassette 250. Accordingly, a temperature and pressure of the spaces 252 may be the same as the temperature and pressure inside the chamber 220, and the autoclave process may be simultaneously performed on all display devices 100 disposed in the spaces 252.

The cassette 250 may include light sources LS disposed in each of the spaces 252. One or more display devices 100 are disposed in each space 252 to be subjected to the autoclave process and the curing process within the chamber 220 of the autoclave 200, as described above. The light sources LS may be simultaneously turned on to perform the curing process on all the display devices 100 disposed in the spaces 252 at the same time. The cassette 250 may be a rectangular parallelepiped as a whole, or may have various shapes.

The display device 100 may be loaded into the spaces 252 of the cassette 250 by using a robot. The cassette 250 may be disposed inside the chamber 220 in a state where the display device 100 is loaded in the cassette 250, or the display device 100 may be loaded in the cassette 250 in a state where the cassette 250 is disposed inside the chamber 220. The cassette 250 may be configured to move in and out of the chamber 220, or may be fixed in the chamber 220.

A portion positioned in a first direction x which is a horizontal direction in the frame 251 may be referred to as a shelf 253. The display device 100 may be disposed on the shelf 253, and a light source LS may be mounted below the shelf 253. The display device 100 may be directly disposed on the shelf 253, or may be disposed on the shelf 253 in a state of being disposed on a separate plate. The light source LS may be fixed to a lower surface of the shelf 253. The light source LS may be coupled to the shelf 253 through a position adjuster capable of moving in at least one of the first direction x, the second direction y, and the third direction z. When the adhesive layer 130 of the display device 100 is formed by using a UV curing type of OCA, the light source LS may include a UV lamp.

A power supply PS may be disposed inside the cassette 250 in order to supply electrical energy to the light source LS. The power supply PS may be a battery. Each light source LS may be connected to wires W connected to the power supply PS to receive the electrical energy. The wires W may be installed along the frame 251, or may be embedded in the frame 251. The power supply PS may be fixed or attached to the outside of the cassette 250.

Since the cassette 250 includes the spaces 252 and the light sources LS, the curing process may be simultaneously performed on a plurality of display devices 100 and a process time may be shortened.

Referring to FIG. 5, the cassette 250 disposed inside the chamber 220 of the autoclave 200 includes the frame 251 and spaces 252 defined by the frame 251. The cassette 250 includes light sources LS fixed or coupled to the shelf 253 in each of the spaces 252. The display device 100 is disposed in each space 252 of the cassette 250 so that the adhesive layer 130 may be cured by using light (e.g., UV) irradiated by the light source LS. Unlike in the embodiment of FIG. 4, the light source LS may receive electrical energy from the power supply PS provided in the autoclave 200, e.g., outside the chamber 220 but inside the case 210. The cassette 250 may include connection means (not illustrated) such as plugs and connection terminals for electrical connection with the power supply PS, and the connection means may be electrically connected to the wires W connected to the power supply PS. As described above, when the power supply PS in the autoclave 200 is used as a power source for the light sources LS, it is not necessary to charge the battery, and thus the handling may be more convenient.

Referring to FIG. 6, for convenience, only the cassette 250 is separated and illustrated. The cassette 250 includes a frame 251 and shelves 253 positioned within a space 252 defined by the frame 251. The shelves 253 may be rotated about a rotation axis X parallel to the second direction y by a rotation unit 254 such as an electric motor. The cassette 250 includes a light source LS therein. The light source LS may be fixedly or movably mounted to an inner surface of an upper portion of the frame 251. The light source LS may receive electrical energy from a power supply mounted in the cassette 250 or externally to the chamber 220 of the autoclave 200.

When viewed from the front, a combination of shelves 253 may be polygonal, and one or more display devices 100 may be disposed on each side of the polygon, that is, on each of the shelves 253. The display devices 100 may be fixed on the shelves 253 without being separated from the shelves 253 regardless of gravity by an attachment means such as an electrostatic chuck or a vacuum chuck.

The curing process may be performed on the display devices 100 disposed on the shelves 253 arranged side by side facing the light source LS in a pressurized state after the autoclave process for all the display devices 100 on the shelves 253 in the chamber 220 of the autoclave 200. Then, the shelves 253 are rotated clockwise or counterclockwise to align the other shelves 253 side by side with the light source LS, and the curing process may be repeated for the display device 100 disposed on the corresponding shelf 253.

Although the embodiment of FIG. 6 has increased the processing time compared to the embodiments of FIG. 4 and FIG. 5 described above, the curing process may be performed on the display devices 100 with one light source LS, thereby reducing a cost.

Referring to FIG. 7, the cassette 250 includes a frame 251 partitioning the spaces 252. The cassette 250 includes shelves 253 that are rotatable about a rotation axis X parallel to the second direction y in each space 252 as described in the embodiment of FIG. 6. When the cassette 250 is configured in this way, the autoclave process and the curing process may be performed on more display devices 100 at a time, thereby reducing the process time. However, the autoclave 200 may be required to have a chamber 220 of a larger volume in order to accommodate the cassette 250.

A configuration of the display panel 110 that may be included by the display device 100 according to an embodiment will be described with reference to FIG. 8.

Figure 8:
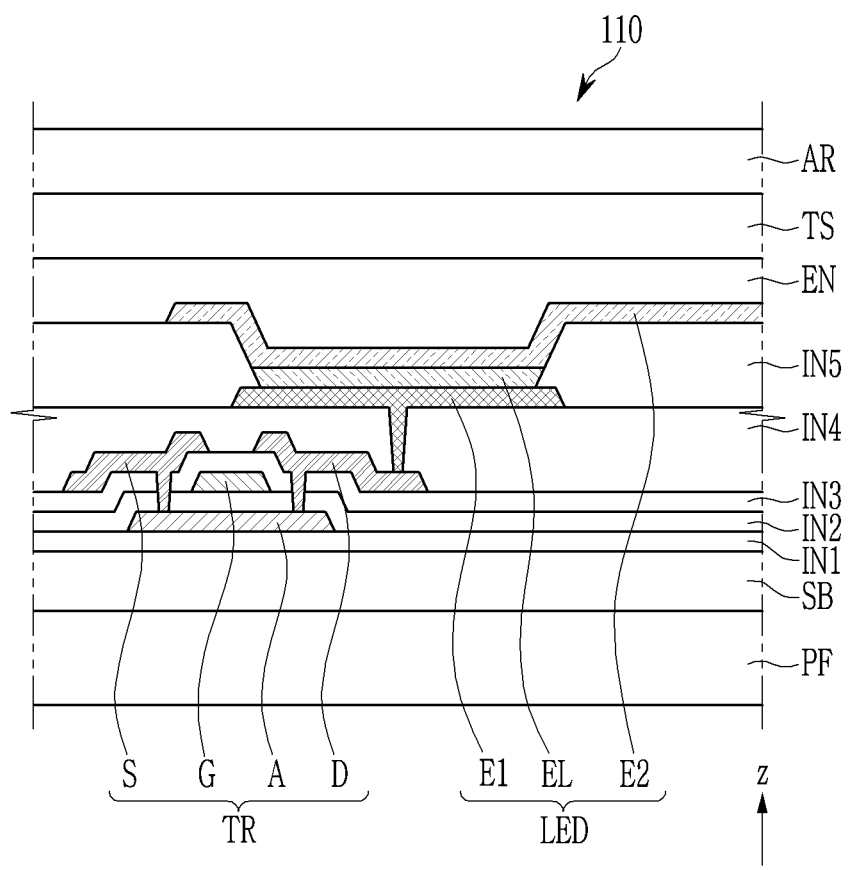
FIG. 8 illustrates a schematic cross-sectional view of a display panel according to an embodiment.

FIG. 8 illustrates a schematic cross-sectional view of the display panel 110 according to an embodiment. The illustrated cross-section may correspond to approximately one pixel area.

The display panel 110 may basically include a substrate SB, a transistor TR formed on the substrate SB, and a light emitting diode LED connected to the transistor TR.

The substrate SB may be a flexible substrate including a polymer such as polyimide (PI), polyamide (PA), or polyethylene terephthalate (PET). The substrate SB may include a barrier layer for preventing moisture, oxygen, etc. from penetrating from the outside. The substrate SB may include one or more polymer layers and one or more barrier layers, and the polymer layers and the barrier layers may be alternately stacked. The substrate SB may be a rigid substrate including glass.

A first insulating layer IN1 may be disposed on the substrate SB. The first insulating layer IN1 may be referred to as a buffer layer, and may serve to block impurities that may diffuse from the substrate SB to a semiconductor layer A and reduce stress applied to the substrate SB in a process of forming the semiconductor layer A. The barrier layer and the first insulating layer IN1 may include an inorganic insulating material such as a silicon oxide, a silicon nitride, or the like.

The semiconductor layer A of the transistor TR may be disposed on the first insulating layer IN1, and a second insulating layer IN2 may be disposed on the semiconductor layer A. The semiconductor layer A may include a source region and a drain region, and a channel region between these regions. The semiconductor layer A may include a semiconductor material such as polysilicon, an oxide semiconductor, and amorphous silicon. The second insulating layer IN2 may be referred to as a gate insulating layer, and may include an inorganic insulating material.

A gate conductor including a gate electrode G of the transistor TR may be disposed to on the second insulating layer IN2. The gate conductor may include a metal such as molybdenum (Mo), copper (Cu), aluminum (Al), silver (Ag), chromium (Cr), tantalum (Ta), or titanium (Ti).

A third insulating layer IN3 may be disposed on the gate conductor. The third insulating layer IN3 may be referred to as an interlayer insulating layer, and may include an inorganic insulating material.

A data conductor including a source electrode S and a drain electrode D of the transistor TR may be disposed on the third insulating layer IN3. The source electrode S and the drain electrode D may be connected to the source region and the drain region of the semiconductor layer A through openings formed in the third insulating layer IN3 and the second insulating layer IN2, respectively. The data conductor is made of a metal such as aluminum (Al), copper (Cu), silver (Ag), molybdenum (Mo), chromium (Cr), gold (Au), platinum (Pt), palladium (Pd), tantalum (Ta), tungsten (W), titanium (Ti), or nickel (Ni).

A fourth insulating layer IN4 may be disposed on the data conductor. The fourth insulating layer IN4 may be referred to as a planarization layer, and may include an organic insulating material. A passivation layer may be further disposed between the data conductor and the fourth insulating layer IN4.

A first electrode E1 may be disposed on the fourth insulating layer IN4. The first electrode E1 may be referred to as a pixel electrode. The first electrode E1 may be connected to the drain electrode D through an opening formed in the fourth insulating layer IN4.

A fifth insulating layer IN5 may be disposed on the fourth insulating layer IN4. The fifth insulating layer IN5 may be referred to as a pixel definition layer, and may have an opening overlapping the first electrode E1. In the opening of the fifth insulating layer IN5, an emission layer EL may be disposed on the first electrode E1, and a second electrode E2 may be disposed on the emission layer EL. The second electrode E2 may be referred to as a common electrode.

The first electrode E1, the emission layer EL, and the second electrode E2 may together constitute a light emitting diode LED, which may be an organic light emitting diode. The first electrode E1 may serve as an anode, and the second electrode E2 may serve as a cathode.

An encapsulation layer EN may be disposed on the second electrode E2. The encapsulation layer EN may encapsulate a light emitting diode LED to prevent moisture or oxygen from penetrating from the outside. The encapsulation layer EN may include at least one inorganic material layer and at least one organic material layer, and the inorganic material layer and the organic material layer may be alternately stacked. A capping layer and/or a functional layer may be disposed between the second electrode E2 and the encapsulation layer EN.

A touch sensor layer TS may be disposed on the encapsulation layer EN. The touch sensor layer TS may include touch electrodes made of a transparent conductive material such as ITO or IZO, a metal mesh, or the like, and the touch electrodes may be formed as a single layer or a multilayer. The touch sensor layer TS may be formed directly on the encapsulation layer EN, or may be separately formed and attached to the encapsulation layer EN.

An anti-reflection layer AR for reducing external light reflection may be disposed on the touch sensor layer TS. The anti-reflection layer AR may include a polarizer. An anti-reflection effect may be obtained by forming the encapsulation layer EN or the touch sensor layer TS in a refractive index matching structure without separately forming the anti-reflection layer AR.

The touch sensor layer TS and/or the anti-reflection layer AR may be attached by an adhesive such as an OCA, and in this case, the autoclave process for removing bubbles and a curing process capable of preventing the generation of permeable bubbles may be performed inside the above-described chamber of the autoclave.

A passivation film PF may be disposed to protect the display panel 110 below the substrate SB. Functional layers such as a shock absorbing layer, a shielding layer, and a heat dissipation layer may be disposed below the protective film PF.

Referring to FIG. 1, the window 120 may be attached to an upper surface of the display panel 110 by the adhesive layer 130.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An autoclave comprising:
   a case;
   a chamber disposed inside the case;
   a cassette removably disposed inside the chamber; and
   a plurality of light sources mounted inside the cassette,
   wherein:
   the cassette includes a frame and a plurality of spaces partitioned by the frame, and the light sources are disposed in the spaces;
   the frame includes shelves disposed in a horizontal direction;
   the light sources are mounted on lower surfaces of the shelves;
   the light sources are movable in and out of the chamber together with the cassette; and
   the autoclave further comprises:
      a power supply disposed in a space where the light sources are not disposed among the spaces; and
      wires electrically connecting the power supply and the light sources.

2. The autoclave of claim 1, wherein
   each of the light sources includes a UV lamp.

3. An autoclave comprising:
   a chamber;
   a cassette removably disposed inside the chamber and including a plurality of shelves configured to support display devices; and
   a plurality of light sources including a light source associated with each of the plurality of shelves and disposed for irradiating light to the display devices,
   wherein:
   the cassette includes a frame and a plurality of spaces partitioned by the frame, and the light sources are disposed one by one in the spaces;
   the frame includes the shelves disposed in a horizontal direction;
   the light sources are mounted on lower surfaces of at least two of the shelves;
   the light sources are movable in and out of the chamber together with the cassette; and
   the autoclave further comprises:

a power supply disposed in a space where the light sources are not disposed among the spaces; and
wires electrically connecting the power supply and the light sources.

\* \* \* \* \*